(12) United States Patent
Katabuchi et al.

(10) Patent No.: US 11,824,528 B2
(45) Date of Patent: Nov. 21, 2023

(54) LOAD DRIVE DEVICE AND CONTROL METHOD OF LOAD DRIVE DEVICE

(71) Applicant: Hitachi Astemo, Ltd., Hitachinaka (JP)

(72) Inventors: Hiroki Katabuchi, Hitachinaka (JP); Kiyoomi Kadoya, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 226 days.

(21) Appl. No.: 17/594,391

(22) PCT Filed: Mar. 13, 2020

(86) PCT No.: PCT/JP2020/011016
§ 371 (c)(1),
(2) Date: Oct. 14, 2021

(87) PCT Pub. No.: WO2020/213318
PCT Pub. Date: Oct. 22, 2020

(65) Prior Publication Data
US 2022/0239295 A1 Jul. 28, 2022

(30) Foreign Application Priority Data

Apr. 19, 2019 (JP) ................. 2019-079844

(51) Int. Cl.
*H03K 17/80* (2006.01)
*F16H 61/02* (2006.01)
*F16K 31/06* (2006.01)

(52) U.S. Cl.
CPC ......... *H03K 17/80* (2013.01); *F16H 61/0206* (2013.01); *F16K 31/0675* (2013.01)

(58) Field of Classification Search
CPC .. H03K 17/80; F16H 61/0206; F16K 31/0675
See application file for complete search history.

(56) References Cited

U.S. PATENT DOCUMENTS

2015/0210232 A1* 7/2015 Kanzaki ................. H02H 7/18
701/36
2018/0212419 A1 7/2018 Yamashita et al.

FOREIGN PATENT DOCUMENTS

| JP | 2012-85038 A | 4/2012 |
|----|----|----|
| JP | 2016-97850 A | 5/2016 |
| JP | 2018-201297 A | 12/2018 |
| WO | WO 2017/057682 A1 | 4/2017 |

OTHER PUBLICATIONS

International Search Report (PCT/ISA/210) issued in PCT Application No. PCT/JP2020/011016 dated Jul. 7, 2020 with English translation (four (4) pages).
Japanese-language Written Opinion (PCT/ISA/237) issued in PCT Application No. PCT/JP2020/011016 dated Jul. 7, 2020 with English translation (three (3) pages).

\* cited by examiner

*Primary Examiner* — Carlos Amaya
(74) *Attorney, Agent, or Firm* — Crowell & Moring LLP

(57) ABSTRACT

Provided is a load drive device with high stability (linearity) and a control method thereof capable of continuing a normal operation without stopping the load drive device even when a reverse current is temporarily detected with a specific inductive load in the load drive device in which a plurality of inductive loads are connected in parallel.

13 Claims, 6 Drawing Sheets

LOAD DRIVE DEVICE AND CONTROL METHOD OF LOAD DRIVE DEVICE

TECHNICAL FIELD

The present invention relates to a configuration of a load drive device that drives and controls an inductive load such as a solenoid valve and control thereof, and particularly relates to a technique that is effective when applied to an in-vehicle load drive device in which stability (linearity) of control is required.

BACKGROUND ART

Conventionally, in a vehicle automatic transmission (transmission system), a mechanism for driving a plurality of solenoid valves has been used. In a general transmission system, a plurality of inductive loads are connected to one controller (load drive device), and vehicle sides of the inductive loads are a common wiring for the purpose of reducing the number of connector terminals and reducing the size.

As a background art of the present technical field, for example, there is a technique such as PTL 1. PTL 1 discloses a "harness wiring method capable of reducing noise radiation and improving immunity of a solenoid valve control circuit", in which one ends of a plurality of solenoid valves are a common wiring with respect to a connection portion of the plurality of solenoid valves and a control device therefor.

PTL 2 discloses a "drive device that achieves highly accurate current control based on a voltage across a flow detection resistor, and enables detection of disconnection of a common wiring by simultaneously detecting a direction of an energizing current", and it is determined that a disconnection abnormality of a common wiring has occurred based on a current change in a common current path monitored by a current monitoring unit of each control drive unit.

CITATION LIST

Patent Literature

PTL 1: JP 2016-97850 A
PTL 2: WO 2017/057682 A

SUMMARY OF INVENTION

Technical Problem

As described above, in a case where a plurality of inductive loads are connected to one load drive device and vehicle sides (sides opposite to the sides connected to the load drive device) of the inductive loads are connected by a common wiring, there is a concern about an influence of a reverse current in which a current flows from one inductive load to the other inductive load.

In the conventional load drive device, when the reverse current is detected, the operation of the load drive device is stopped, and there is a possibility that it is determined as abnormal although the common wiring is in a normal state.

In a vehicle automatic transmission (transmission system), when an operation of a load drive device is temporarily stopped, a speed change shock is deteriorated, that is, stability (linearity) of control is deteriorated, and ride comfort (driving comfort) of an occupant is deteriorated.

Therefore, an object of the present invention is to provide a load drive device with high stability (linearity) and a control method thereof capable of continuing a normal operation without stopping the load drive device even when a reverse current is temporarily detected with a specific inductive load in the load drive device in which a plurality of inductive loads are connected in parallel.

Solution to Problem

In order to solve the above problems, the present invention provides a load drive device, including: a first switch element; a second switch element; a current and direction detection unit that detects a current flowing through the first switch element in a forward direction and a reverse direction; a current and direction detection unit that detects a current flowing through the second switch element in the forward direction and the reverse direction; a control unit that calculates an average current based on signals from the current and direction detection units; a drive unit that drives the first switch element and the second switch element based on a deviation between the average current and a target current; and a plurality of inductive loads in which one end portions are connected to a common current path of the first switch element and the second switch element, and wirings for another end portions are connected to a common wiring at one point, in which a reverse current is detected by the current and direction detection unit when the second switch element is turned on, and a current is continuously monitored even when the average current calculated by the control unit is in a direction reverse to a normal direction.

Further, the present invention provides a control method of a load drive device in which a plurality of inductive loads are connected in parallel, the control method including: detecting a current value and a current direction of each of the plurality of inductive loads; comparing a detected current value with a predetermined threshold when a detected current direction is a direction reverse to a predetermined current direction; and continuing an operation of the load drive device when the detected current value is smaller than the predetermined threshold.

Advantageous Effects of Invention

According to the present invention, it is possible to realize the load drive device with high stability (linearity) and the control method thereof capable of continuing the normal operation without stopping the load drive device even when a reverse current is temporarily detected with a specific inductive load in the load drive device in which the plurality of inductive loads are connected in parallel.

As a result, in a vehicle automatic transmission (transmission system) that drives and controls a plurality of solenoid valves, it is possible to reduce a scene where a speed change shock is deteriorated, and ride comfort (driving comfort) of an occupant is improved.

Problems, configurations, and effects other than those described above will be clarified by the following description of embodiments.

DESCRIPTION OF EMBODIMENTS

Figure 1:
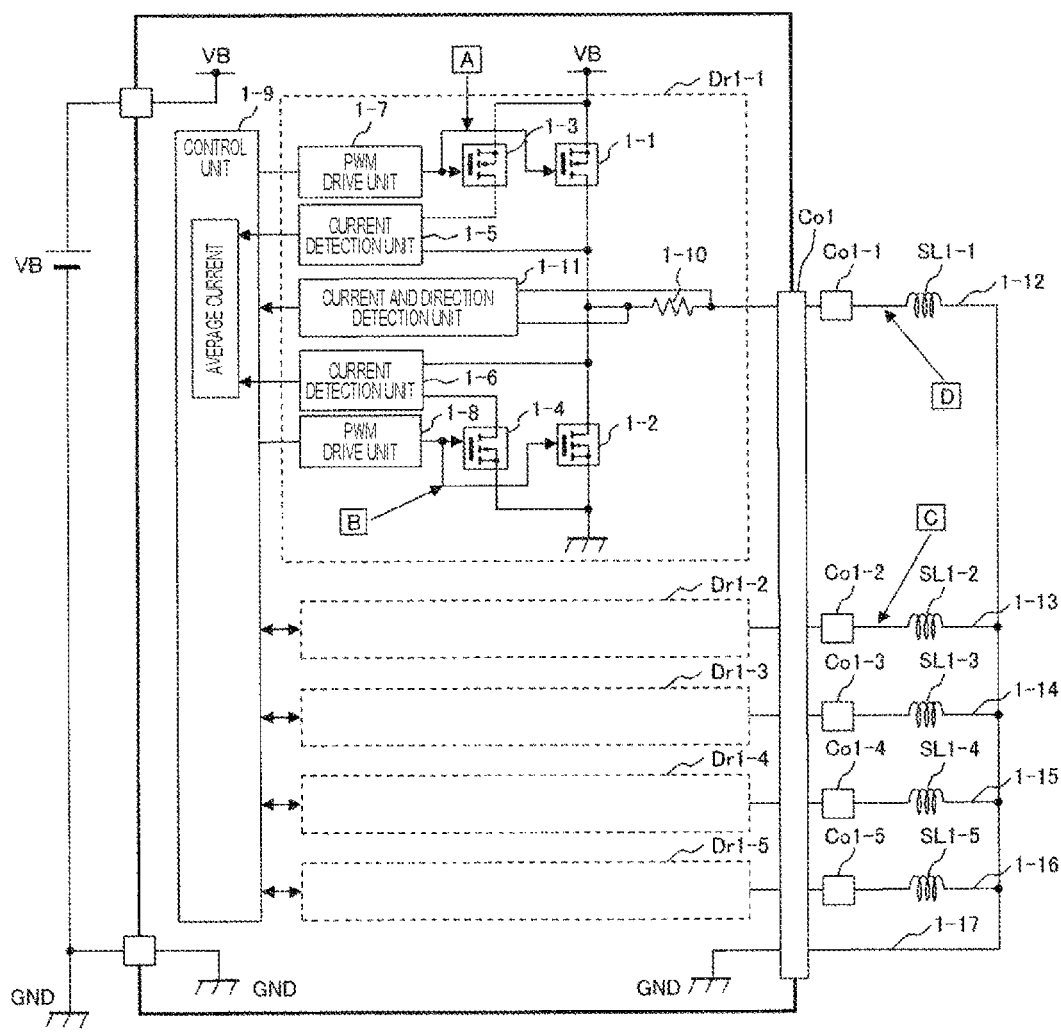
FIG. 1 is a diagram illustrating a circuit configuration of a typical load drive device in a conventional vehicle automatic transmission (transmission system).

Hereinafter, embodiments according to the present invention will be described with reference to the drawings. In the drawings, the same components are denoted by the same reference numerals, and the detailed description of overlapping portions is omitted.

First Embodiment

A configuration of a load drive device and a control method thereof according to a first embodiment of the present invention will be described with reference to FIGS. 1 to 6.

In order to make the configuration of the present embodiment easy to understand, first, a conventional load drive device will be described with reference to FIGS. 1, 3, and 5. FIG. 1 is a circuit configuration diagram of a conventional general load drive device illustrated as a comparative example.

As illustrated in FIG. 1, the conventional load drive device includes driver units Dr1-1 to Dr1-5, a control unit 1-9 that controls each driver unit of the driver units Dr1-1 to Dr1-5, and a connector terminal Co1 capable of connecting a plurality of inductive loads in parallel.

The driver unit Dr1-1 includes a first switch element 1-1, a second switch element 1-2, a first current detection switch element 1-3 connected in parallel to the first switch element 1-1, a second current detection switch element 1-4 connected in parallel to the second switch element 1-2, a current detection unit 1-5 for the first current detection switch element 1-3, a current detection unit 1-6 for the second current detection switch element 1-4, a first PWM drive unit 1-7 that drives the first switch element 1-1 and the first current detection switch element 1-3, a second PWM drive unit 1-8 that drives the second switch element 1-2 and the second current detection switch element 1-4, a current detection resistor 1-10 connected to a common current path of the first switch element 1-1 and the second switch element 1-2, and a current and direction detection unit 1-11 that detects a current and a direction based on a voltage across the current detection resistor 1-10.

The control unit 1-9 calculates an average current based on signals from the current detection unit 1-5 and the current detection unit 1-6.

The driver units Dr1-2 to Dr1-5 have the same function as the driver unit Dr1-1.

The driver units Dr1-1 to Dr1-5 are connected to the connector terminal Co1. Connector terminals Co1-1 to Co1-5 which are one end portions of inductive loads SL1-1 to SL1-5 are respectively connected to the driver units Dr1-1 to Dr1-5, and the other ends of the inductive loads SL1-1 to SL1-5 are respectively connected to a common wiring 1-17 via wirings 1-12 to 1-16.

Figure 3:
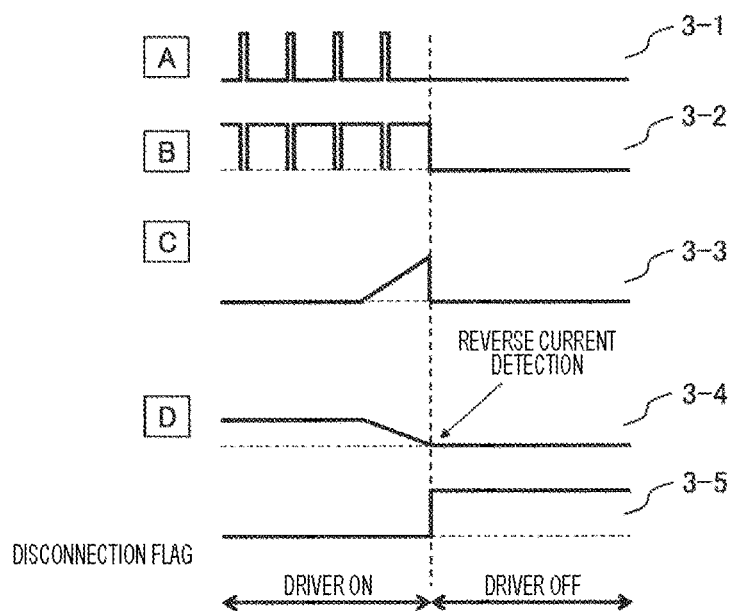
FIG. 3 is a timing chart illustrating an operation (action) of the load drive device of FIG. 1.

FIG. 3 is a timing chart illustrating an operation (action) of the conventional load drive device illustrated in FIG. 1. A to D of FIG. 3 illustrate operations of A to D of FIG. 1, respectively. As illustrated in timing charts 3-1 and 3-2 of FIG. 3, by alternately turning on and OFF the first switch element 1-1 and the second switch element 1-2, a current flows into the inductive load SL1-1 as illustrated in a timing chart 3-4.

At this time, when the current flows to the inductive load SL1-2 as illustrated in a timing chart 3-3, the current (reverse current) also flows to the inductive load SL1-1. As illustrated in the timing chart 3-4, the difference between the inflow current (reverse current) and the magnitude of the current flowing from the driver unit Dr1-1 to the inductive load SL1-1 is the current of the inductive load SL1-1.

When the current flows in the direction reverse to the normal direction in the inductive load SL1-1, the current and direction detection unit 1-11 detects the reverse current, determines that the common wiring 1-17 is disconnected, sets a disconnection flag in the control unit 1-9 as illustrated in the timing chart 3-5, and turns OFF both the first switch element and the second switch element of each of the driver units Dr1-1 to Dr1-5 to stop the operations of the driver units Dr1-1 to Dr1-5.

Figure 5:
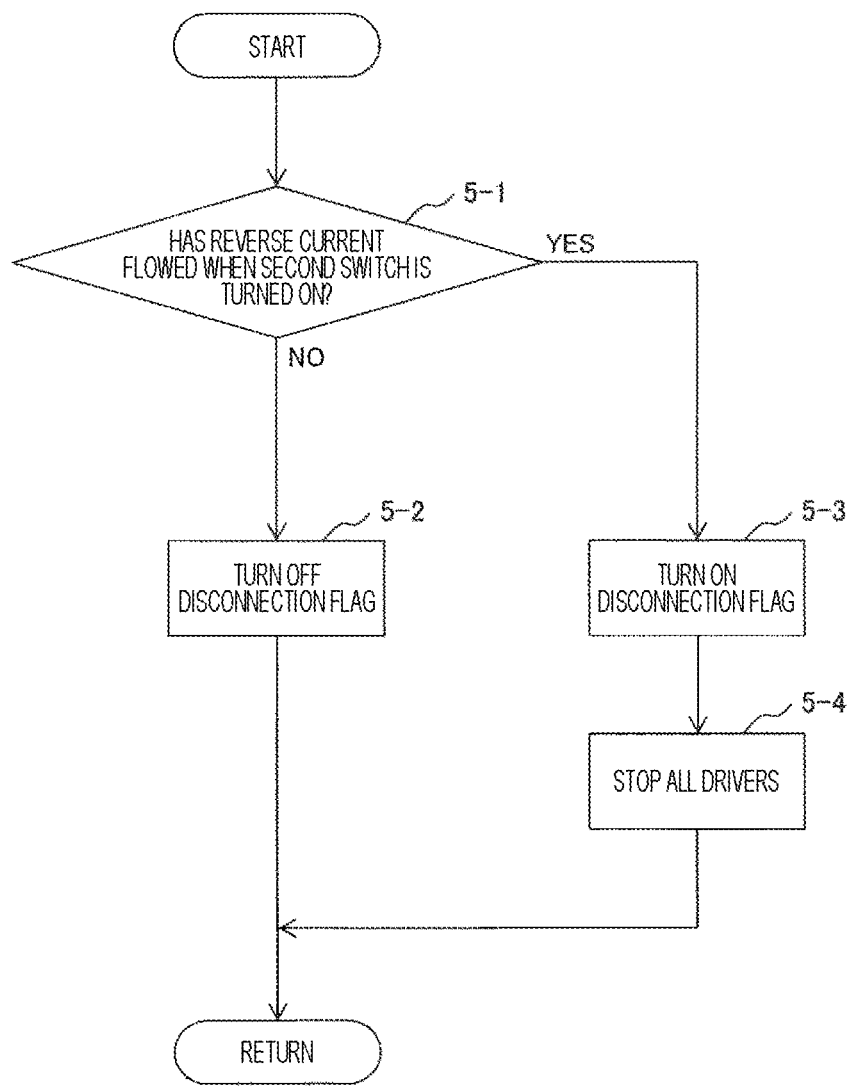
FIG. 5 is a flowchart illustrating an operation flow of an abnormality diagnosis function of a common wiring in the load drive device of FIG. 1.

FIG. 5 is a flowchart illustrating an operation flow of an abnormality diagnosis function of the common wiring 1-17 in the load drive device of FIG. 1. In any one of the driver units Dr1-1 to Dr1-5, it is determined whether or not a reverse current has flowed when the second switch element is turned on (step 5-1). When it is determined that the current detected by the current and direction detection unit 1-11 is in the normal direction (NO), the disconnection flag is turned OFF (step 5-2), and the normal operations of the driver units Dr1-1 to Dr1-5 are continued.

On the other hand, when it is determined in step 5-1 that the current detected by the current and direction detection unit 1-11 is in the direction reverse to the normal direction (reverse current) (YES), the disconnection flag is turned ON (step 5-3), and both the first switch element and the second switch element held by each of the driver units Dr1-1 to Dr1-5 are turned OFF, so that the operations of all the drivers (driver units Dr1-1 to Dr1-5) are stopped (step 5-4). As a result, a speed change shock is deteriorated, and driving comfort is significantly deteriorated.

Next, the load drive device according to the present embodiment will be described with reference to FIGS. 2, 4, and 6.

<<Configuration of Load Drive Device>>

Figure 2:
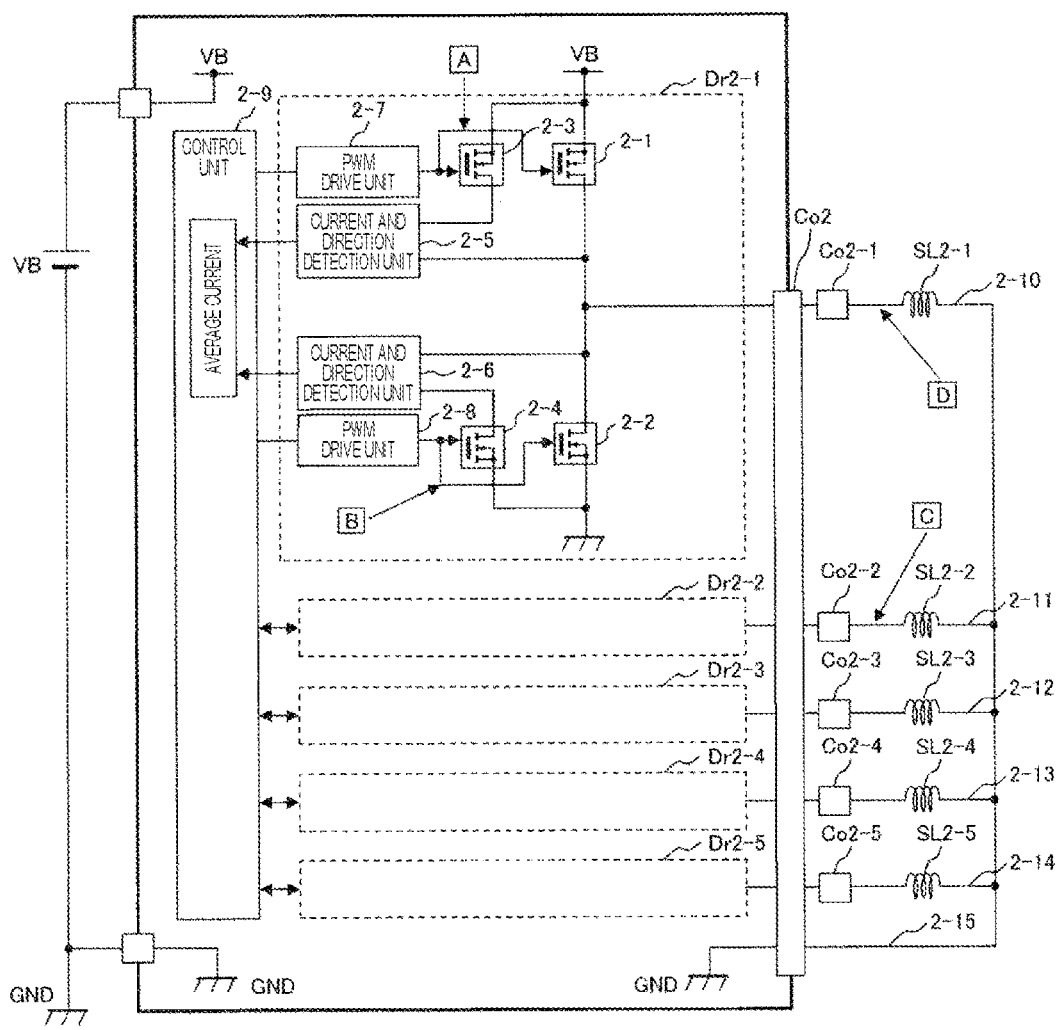
FIG. 2 is a diagram illustrating a circuit configuration of a load drive device according to a first embodiment of the present invention.

FIG. 2 is a circuit configuration diagram of the load drive device according to the present embodiment. As illustrated in FIG. 2, the load drive device according to the present embodiment includes driver units Dr2-1 to Dr2-5, a control unit 2-9 that controls each driver unit of the driver units Dr2-1 to Dr2-5, and a connector terminal Co2 capable of connecting a plurality of inductive loads in parallel.

The driver unit Dr2-1 includes a first switch element 2-1, a second switch element 2-2, a first current detection switch element 2-3 connected in parallel to the first switch element 2-1, a second current detection switch element 2-4 connected in parallel to the second switch element 2-2, a current and direction detection unit 2-5 for the first current detection switch element 2-3, a current and direction detection unit 2-6 for the second current detection switch element 2-4, a first PWM drive unit 2-7 that drives the first switch element 2-1 and the first current detection switch element 2-3, and a second PWM drive unit 2-8 that drives the second switch element 2-2 and the second current detection switch element 2-4.

The control unit 2-9 calculates an average current based on signals from the current and direction detection unit 2-5 and the current and direction detection unit 2-6.

The driver units Dr2-2 to Dr2-5 have the same function as the driver unit Dr2-1.

The driver units Dr2-1 to Dr2-5 are connected to the connector terminal Co2. Connector terminals Co2-1 to Co2-5 which are one end portions of inductive loads SL2-1 to SL2-5 are respectively connected to the driver units Dr2-1 to Dr2-5, and the other ends of the inductive loads SL2-1 to SL2-5 are respectively connected to a common wiring 2-15 via wirings 2-10 to 2-14.

<<Feedback Control Based on Reverse Current>>

Figure 4:
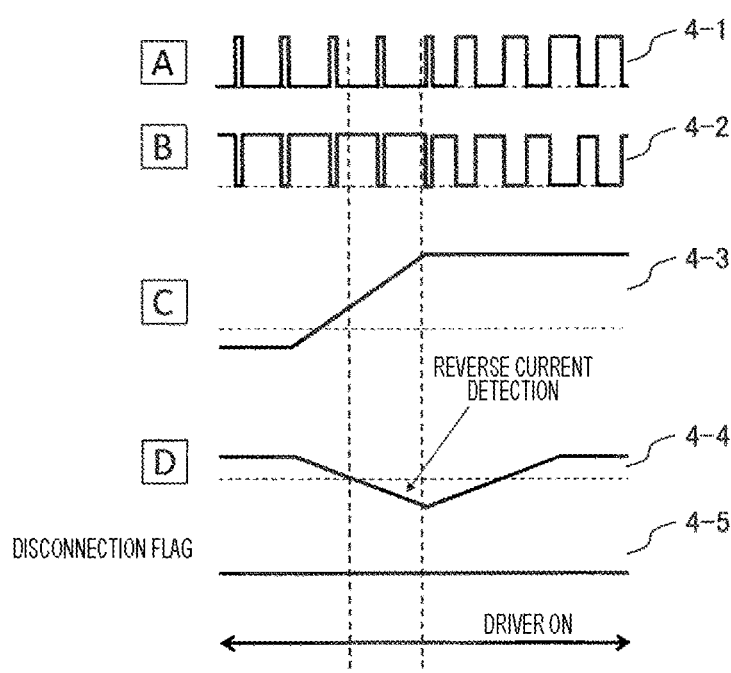
FIG. 4 is a timing chart illustrating an operation (action) of the load drive device of FIG. 2.

FIG. 4 is a timing chart illustrating an operation (action) of the load drive device according to the present embodiment illustrated in FIG. 2. A to D of FIG. 4 illustrate operations of A to D of FIG. 2, respectively. As illustrated in timing charts 4-1 and 4-2 of FIG. 4, by alternately turning ON and OFF the first switch element 2-1 and the second switch element 2-2, a current flows into the inductive load SL2-1 as illustrated in a timing chart 4-4.

At this time, when the current flows to the inductive load SL2-2 as illustrated in a timing chart 4-3, the current (reverse current) also flows to the inductive load SL2-1. As illustrated in the timing chart 4-4, the difference between the inflow current (reverse current) and the magnitude of the current flowing from the driver unit Dr2-1 to the inductive load SL2-1 is the current of the inductive load SL2-1.

Even when this current flows in the direction reverse to the normal direction in the inductive load SL2-1, monitoring of the average current is continued in the control unit 2-9, and feedback control can be performed based on the divergence between the temporary transient reverse current that changes with time and a target value, so that a target current value can be held with high accuracy even in a low indicator current region.

As a result, even when the instruction current calculated by the control unit 2-9 is 0A, 0A can be reliably held while the feedback control is continued.

<<Operation Flow of Common Wiring Abnormality Diagnosis Function>>

In an abnormality diagnosis function of the common wiring 2-15, it is determined that the common wiring 2-15 is abnormal (for example, disconnected) when the average current calculated by the control unit 2-9 is in the direction reverse to the normal direction and exceeds a predetermined abnormality determination threshold.

Figure 6:
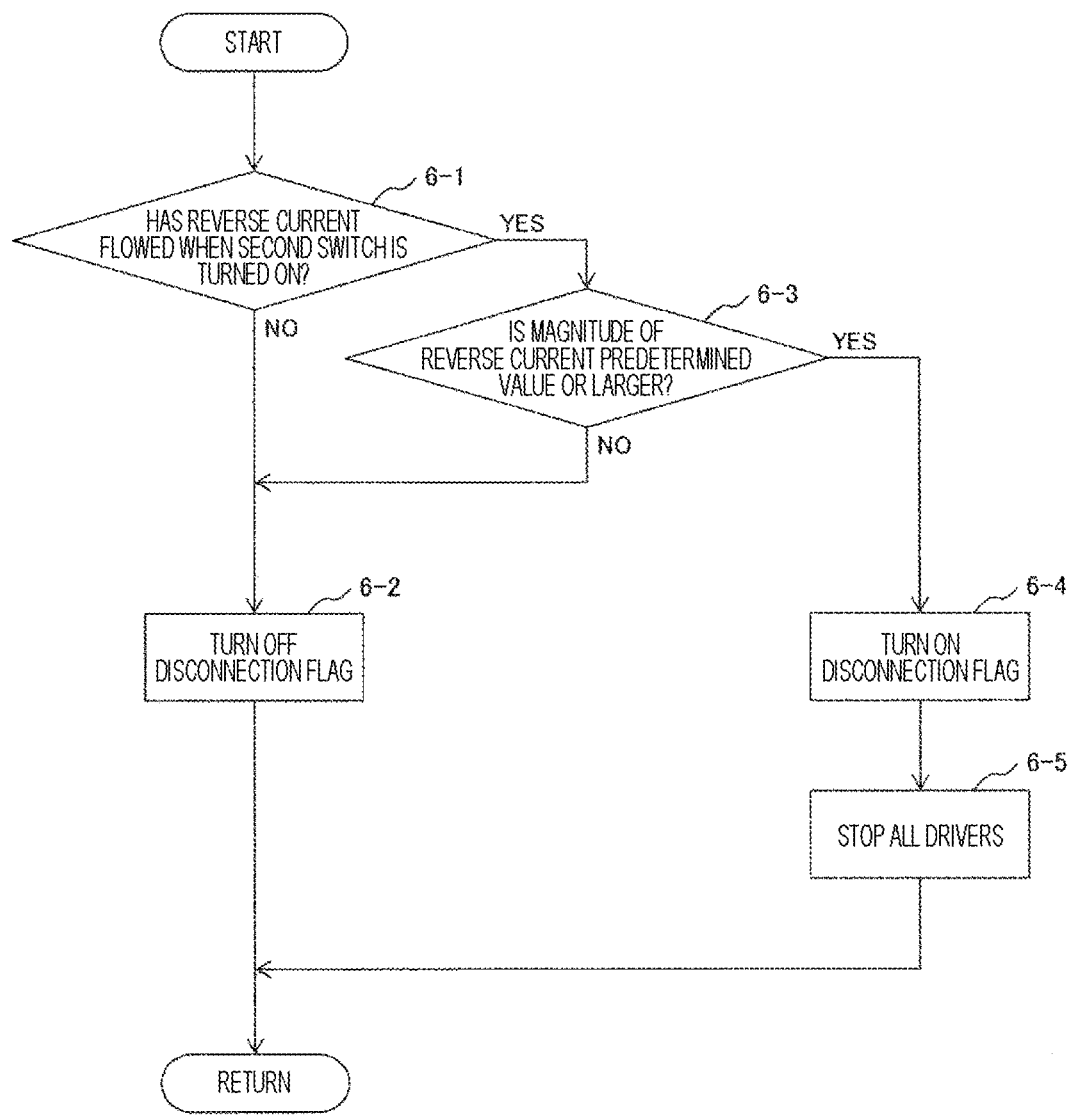
FIG. 6 is a flowchart illustrating an operation flow of an abnormality diagnosis function of a common wiring in the load drive device of FIG. 2.

An operation flow of the abnormality diagnosis function according to the present embodiment is illustrated in FIG. 6. In any one of the driver units Dr2-1 to Dr2-5, it is determined whether or not a reverse current has flowed when the second switch element is turned ON (step 6-1). When it is determined that the current detected by the current and direction detection unit 2-6 or the average current calculated by the control unit 2-9 is in the normal direction (NO), a disconnection flag is turned OFF (step 6-2), and the normal operations of the driver units Dr2-1 to Dr2-5 are continued.

On the other hand, when it is determined in step 6-1 that the current detected by the current and direction detection unit 2-6 or the average current calculated by the control unit 2-9 is in the direction reverse to the normal direction (reverse current) (YES), it is determined whether or not the magnitude of the current in the reverse direction is a predetermined value (predetermined threshold) or larger (step 6-3).

When the magnitude of the current in the reverse direction is smaller than the predetermined threshold (NO), the disconnection flag is turned OFF (step 6-2), and the normal operations of the driver units Dr2-1 to Dr2-5 are continued.

When the magnitude of the current in the reverse direction is equal to or larger than the predetermined value (predetermined threshold) (YES), the disconnection flag is turned ON (step 6-4), and both the first switch element and the second switch element of each of the driver units Dr2-1 to Dr2-5 are turned OFF, so that the operations of the driver units Dr2-1 to Dr2-5 are stopped.

Therefore, in the reverse current region smaller than the abnormality determination threshold, the normal state is continued without stopping the operation of the load drive device, so that it is possible to reduce the scene in which the speed change shock is deteriorated.

<<Abnormality Determination Threshold>>

The abnormality determination threshold is set to a value having a constant margin with respect to the magnitude of the current at which the inductive loads SL2-1 to SL2-5 operate or the magnitude of the current at which the inductive loads SL2-1 to SL2-5 operate.

In the load drive device according to the present embodiment, the current and direction detection units 2-5 and 2-6 detect not only the magnitude of the current but also the flowing direction of the current, and even if the flowing direction of the average current calculated by the control unit 2-9 is in the direction reverse to the normal direction, the current is continuously monitored without stopping the driving of the inductive load SL2-1 by the driver unit Dr2-1, as compared with the conventional technique. In the present embodiment, the current value and the current direction are detected for each of the plurality of switch elements constituting the load drive device.

Even when the flowing direction of the average current is the reverse direction, feedback control can be performed based on the divergence between the average current calculated by the control unit 2-9 and a target value, so that a target current value can be held with high accuracy even in a low indicator current region.

As described above, the load drive device according to the present embodiment includes the first switch element 2-1, the second switch element 2-2, the current and direction detection unit 2-5 that detects the current flowing through the first switch element 2-1 in the forward direction and the reverse direction, the current and direction detection unit 2-6 that detects the current flowing through the second switch element 2-2 in the forward direction and the reverse direction, the control unit 2-9 that calculates the average current based on the signals from the current and direction detection units 2-5 and 2-6, the drive unit (driver unit Dr2-1) that drives the first switch element 2-1 and the second switch element 2-2 based on the deviation between the average current and the target current, and the plurality of inductive loads SL2-1 to SL2-5 in which one end portions are connected to the common current path of the first switch element 2-1 and the second switch element 2-2, and the wirings for the other end portions are connected to the common wiring 2-15 at one point, in which the reverse current is detected by the current and direction detection unit 2-5 when the second switch element 2-2 is turned ON, and the current is continuously monitored even when the average current calculated by the control unit 2-9 is in the direction reverse to the normal direction.

Even when the average current calculated by the control unit 2-9 is in the direction reverse to the normal direction, the average current is canceled, and the feedback control is continued so as to approach the target current.

In addition, the current detected by the current and direction detection unit 2-5 or the average current calculated by the control unit 2-9 has the abnormality determination threshold of the common wiring 2-15 in the current region in the direction reverse to the normal direction, and when the current or the average current exceeds the abnormality determination threshold, it is determined that the common wiring 2-15 is abnormal, and one inductive load SL2-1 or the plurality of inductive loads SL2-1 to SL2-5 are controlled based on the abnormality determination process of the control unit 2-9.

The abnormality determination threshold is set in the current region in the direction reverse to the normal direction so as to have a magnitude of the current being a magnitude for operating the inductive loads SL2-1 to SL2-5 or smaller than the magnitude.

Further, in the present embodiment (FIG. 2), the common wiring 2-15 is a GND line connected to GND, and the second switch element 2-2 is a switch element connected to a low side.

According to the load drive device and the control method thereof according to the present embodiment, it is possible to realize the load drive device with high stability (linearity) and the control method thereof capable of continuing the normal operation without stopping the load drive device even when a reverse current is temporarily detected with a specific inductive load in the load drive device in which the plurality of inductive loads are connected in parallel.

As a result, in a vehicle automatic transmission (transmission system) that drives and controls a plurality of solenoid valves, it is possible to reduce a scene where a speed change shock is deteriorated, and ride comfort (driving comfort) of an occupant is improved.

In addition, the detectability of the abnormality diagnosis on the common wiring 2-15 can be improved, and the reliability of the load drive device can be improved.

Second Embodiment

Figure 7:
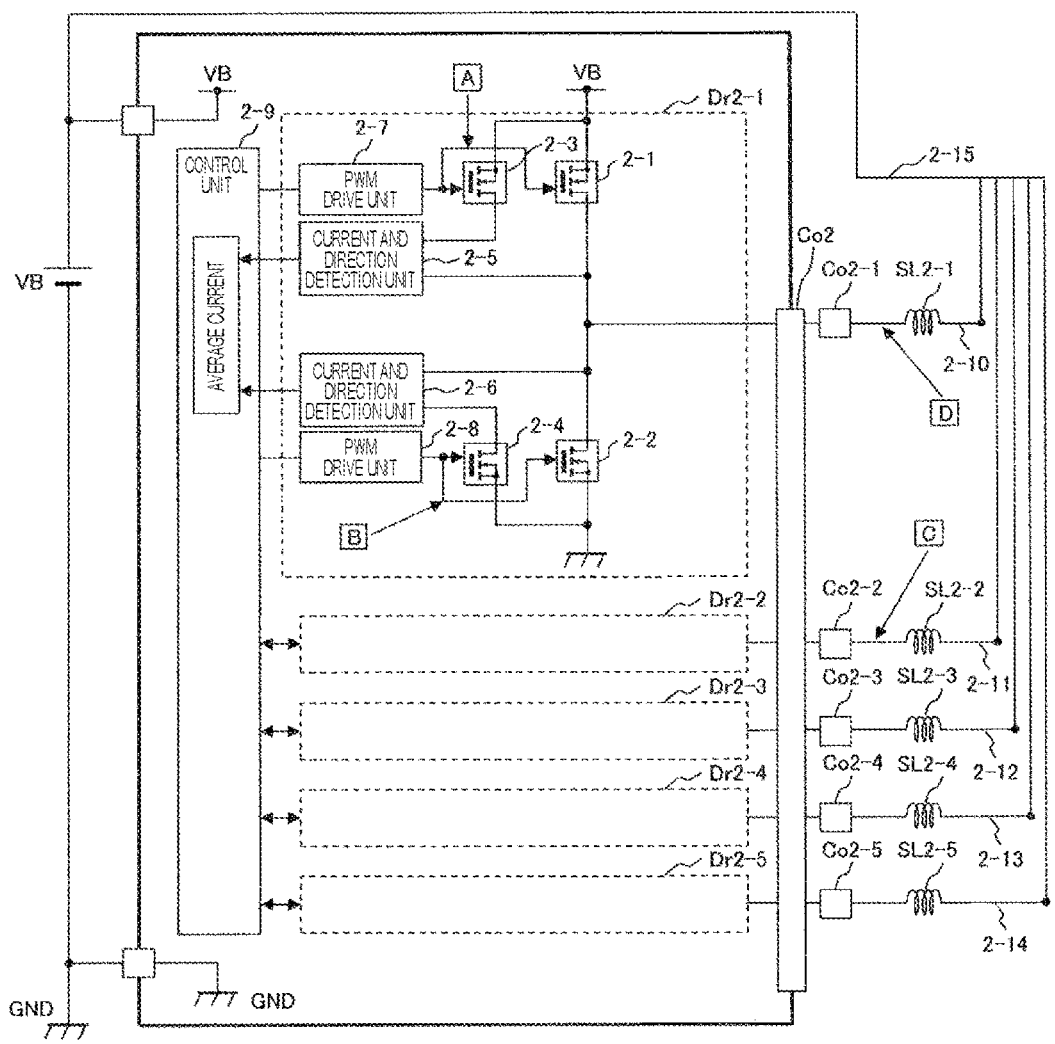
FIG. 7 is a diagram illustrating a circuit configuration of a load drive device according to a second embodiment of the present invention.

A configuration of a load drive device and a control method thereof according to a second embodiment of the present invention will be described with reference to FIG. 7. FIG. 7 is a circuit configuration diagram of the load drive device according to the present embodiment.

<<Configuration of Load Drive Device>>

In the first embodiment (FIG. 2), the common wiring 2-15 is the GND line, and this is based on the assumption that the driving system of the inductive loads SL2-1 to SL2-5 is high-side driving. When the driving system of the inductive loads SL2-1 to SL2-5 is low-side driving, as illustrated in FIG. 7, the common wiring 2-15 is a battery line.

<<Operation Flow of Common Wiring Abnormality Diagnosis Function>>

A current flowing through the inductive loads SL2-1 to SL2-5 in the reverse direction flows into the first switch element 2-1, and the current and direction detection unit 2-5 detects the current in the reverse direction.

Therefore, as in the present embodiment (FIG. 7), in the operation flow in a case where the driving system of the inductive loads SL2-1 to SL2-5 is the low-side driving, in step 6-1 of FIG. 6, a reverse current flows when the first switch element is turned ON.

In the present embodiment (FIG. 7), the common wiring 2-15 is a power supply (battery) line connected to a power supply VB, and the second switch element 2-2 is a switch element connected to a high side.

The present invention is not limited to the embodiments described above, but includes various modifications.

For example, the embodiments described above have been described in detail for easy understanding of the present invention, and are not necessarily limited to those having all the configurations described. Further, a part of the configuration of one embodiment can be replaced with the configuration of another embodiment, and further, the configuration of one embodiment can be added to the configuration of another embodiment. In addition, it is possible to add, delete, and replace other configurations for a part of the configuration of each embodiment.

INDUSTRIAL APPLICABILITY

In each of the embodiments described above, the load drive device of the vehicle automatic transmission (transmission system) including a linear solenoid valve has been described, but the present invention is also applicable to, for example, an inkjet printer valve, a massage chair, and the like using a plurality of solenoid valves as a pressure adjustment valve and a direction switching valve for oil or air.

REFERENCE SIGNS LIST 1-1 first switch element
1-2 second switch element
1-3 (first) current detection switch element
1-4 (second) current detection switch element
1-5 current detection unit (of first switch element)
1-6 current detection unit (of second switch element)
1-7 (first) PWM drive unit
1-8 (second) PWM drive unit
1-9 control unit
1-10 current detection resistor
1-11 current and direction detection unit
1-12 to 1-16 other end portion of inductive load (wiring)
1-17 common wiring
Co1 connector terminal (of load drive device)
Co1-1 to Co1-5 one end portion of inductive load (connector terminal)
Dr1-1 to Dr1-5 driver unit
SL1-1 to SL1-5 inductive load
2-1 first switch element
2-2 second switch element
2-3 (first) current detection switch element
2-4 (second) current detection switch element
2-5 current and direction detection unit (of first switch element)
2-6 current and direction detection unit (of second switch element)
2-7 (first) PWM drive unit
2-8 (second) PWM drive unit
2-9 control unit
2-10 to 2-14 other end portion of inductive load (wiring)
2-15 common wiring
Co2 connector terminal (of load drive device)
Co2-1 to Co2-5 one end portion of inductive load (connector terminal)
Dr2-1 to Dr2-5 driver unit
SL2-1 to SL2-5 inductive load 3-1 to 3-5 timing chart (at time of detection of reverse current in conventional technique)
4-1 to 4-5 timing chart (at time of detection of reverse current in first embodiment)
5-1 to 5-4 step (in flowchart at time of detection of reverse current in conventional technique)
6-1 to 6-5 step (in flowchart at time of detection of reverse current in first embodiment)

The invention claimed is:

1. A load drive device, comprising:
a first switch element;
a second switch element;
a current and direction detection unit that detects a current flowing through the first switch element in a forward direction and a reverse direction;
a current and direction detection unit that detects a current flowing through the second switch element in the forward direction and the reverse direction;
a control unit that calculates an average current based on signals from the current and direction detection units;
a drive unit that drives the first switch element and the second switch element based on a deviation between the average current and a target current; and
a plurality of inductive loads in which one end portions are connected to a common current path of the first switch element and the second switch element, and wirings for another end portions are connected to a common wiring at one point,
wherein a reverse current is detected by the current and direction detection unit when the second switch element is turned ON, and a current is continuously monitored even when the average current calculated by the control unit is in a direction reverse to a normal direction.

2. The load drive device according to claim 1, wherein, even when the average current calculated by the control unit is in a direction reverse to the normal direction, the average current is canceled, and feedback control is continued so as to approach a target current.

3. The load drive device according to claim 1, wherein the current detected by the current and direction detection unit or the average current calculated by the control unit has an abnormality determination threshold of the common wiring in a current region in a direction reverse to the normal direction, and when the current or the average current exceeds the abnormality determination threshold, it is determined that the common wiring is abnormal, and one inductive load or the plurality of inductive loads are controlled based on an abnormality determination process of the control unit.

4. The load drive device according to claim 3, wherein the abnormality determination threshold is set in the current region in the direction reverse to the normal direction so as to have a magnitude of a current being a magnitude for operating the inductive load or smaller than the magnitude.

5. The load drive device according to claim 1, wherein the common wiring is a GND line.

6. The load drive device according to claim 5, wherein the second switch element is a switch element connected to a low side.

7. The load drive device according to claim 1, wherein the common wiring is a power supply line.

8. The load drive device according to claim 7, wherein the second switch element is a switch element connected to a high side.

9. A control method of a load drive device in which a plurality of inductive loads are connected in parallel, the control method comprising:
detecting a current value and a current direction of each of the plurality of inductive loads;
comparing a detected current value with a predetermined threshold when a detected current direction is a direction reverse to a predetermined current direction; and
continuing an operation of the load drive device when the detected current value is smaller than the predetermined threshold.

10. The control method of a load drive device according to claim 9, wherein the operation of the load drive device is stopped when the detected current value is equal to or larger than the predetermined threshold.

11. The control method of a load drive device according to claim 9, wherein a current value and a current direction are detected for each of a plurality of switch elements constituting the load drive device.

12. The control method of a load drive device according to claim 9,
wherein opposite sides of the plurality of inductive loads connected to the load drive device are connected to a common wiring, and
wherein the common wiring is a GND line.

13. The control method of a load drive device according to claim 9,
wherein opposite sides of the plurality of inductive loads connected to the load drive device are connected to a common wiring, and
wherein the common wiring is a power supply line.

* * * * *